United States Patent
Braithwaite

(10) Patent No.: US 7,756,493 B2
(45) Date of Patent: **\*Jul. 13, 2010**

(54) FEED FORWARD AMPLIFIER SYSTEM AND METHOD USING THE PILOT FREQUENCY FROM A POSITIVE FEEDBACK PILOT GENERATION AND DETECTION CIRCUIT TO IMPROVE SECOND LOOP CONVERGENCE

(75) Inventor: Richard Neil Braithwaite, Orange, CA (US)

(73) Assignee: Powerwave Technologies, Inc., Santa Ana, CA (US)

( \* ) Notice: Subject to any disclaimer, the term of this patent is extended or adjusted under 35 U.S.C. 154(b) by 882 days.

This patent is subject to a terminal disclaimer.

(21) Appl. No.: 11/392,170

(22) Filed: Mar. 29, 2006

(65) Prior Publication Data

US 2006/0222104 A1    Oct. 5, 2006

Related U.S. Application Data

(60) Provisional application No. 60/668,363, filed on Apr. 5, 2005, provisional application No. 60/670,908, filed on Apr. 13, 2005.

(51) Int. Cl.
*H04B 1/04* (2006.01)
(52) U.S. Cl. ............. 455/127.1; 455/114.3; 455/127.2; 330/52
(58) Field of Classification Search ............. 455/127.1, 455/127.2; 330/280, 151
See application file for complete search history.

(56) References Cited

U.S. PATENT DOCUMENTS

| | | | |
|---|---|---|---|
| 5,166,634 A * | 11/1992 | Narahashi et al. ........... 330/151 |
| 5,923,214 A * | 7/1999 | Mitzlaff ........................ 330/52 |
| 6,081,156 A * | 6/2000 | Choi et al. .................... 330/52 |
| 6,147,555 A | 11/2000 | Posner et al. |
| 6,326,840 B1 * | 12/2001 | Funada et al. ................. 330/52 |
| 6,700,441 B1 * | 3/2004 | Zhang et al. ............. 455/127.1 |
| 6,794,933 B2 | 9/2004 | Gurvich et al. |
| 6,859,101 B1 * | 2/2005 | Leffel ......................... 330/280 |
| 7,002,407 B2 | 2/2006 | Hunton et al. |
| 7,010,282 B2 * | 3/2006 | Kazakevich et al. ..... 455/127.1 |
| 7,113,035 B2 * | 9/2006 | Koukkari et al. ............ 330/136 |
| 7,123,086 B2 | 10/2006 | Braithwaite |

(Continued)

OTHER PUBLICATIONS

International Searching Authority (ISA/US)—The International Search Report and The Written Opinion for PCT/US06/12202 dated Aug. 15, 2007, 8 pages.

(Continued)

*Primary Examiner*—Lana N Le
(74) *Attorney, Agent, or Firm*—David L. Henty

(57) ABSTRACT

A pilot system and method is disclosed that increases the rate of convergence of the second loop alignment control in a feed forward amplifier. Both a pilot generation and detection system and search algorithm controlling the alignment are disclosed. By measuring the frequency of the generated pilot, phase information regarding the second loop cancellation transfer function can be inferred. Changes in the pilot frequency as the search algorithm makes steps in the second loop alignment indicate errors in the direction of the search. Using this pilot frequency measurement along with the existing log-power measurement of the residual pilot power improves the convergence speed because fewer steps will be made to reach the optimal alignment setting.

14 Claims, 7 Drawing Sheets

U.S. PATENT DOCUMENTS

| | | |
|---|---|---|
| 7,157,967 B2 | 1/2007 | Braithwaite |
| 7,187,232 B2 | 3/2007 | Braithwaite et al. |
| 7,295,819 B2 * | 11/2007 | Kenington et al. ....... 455/127.2 |
| 2003/0181191 A1 | 9/2003 | Gentzler |
| 2004/0075497 A1 * | 4/2004 | Miyaji et al. ................ 330/151 |
| 2004/0251961 A1 | 12/2004 | Braithwaite |
| 2005/0052241 A1 * | 3/2005 | Leffel ......................... 330/280 |
| 2005/0168283 A1 * | 8/2005 | Suzuki et al. ............... 330/149 |
| 2006/0160502 A1 * | 7/2006 | Kintis ..................... 455/127.1 |
| 2006/0176113 A1 * | 8/2006 | Braithwaite et al. ........... 330/52 |
| 2007/0018723 A1 * | 1/2007 | Arbab et al. ................. 330/151 |

OTHER PUBLICATIONS

Supplementary European Search Report for Application No. 06758256.9 dated Nov. 11, 2009.

* cited by examiner

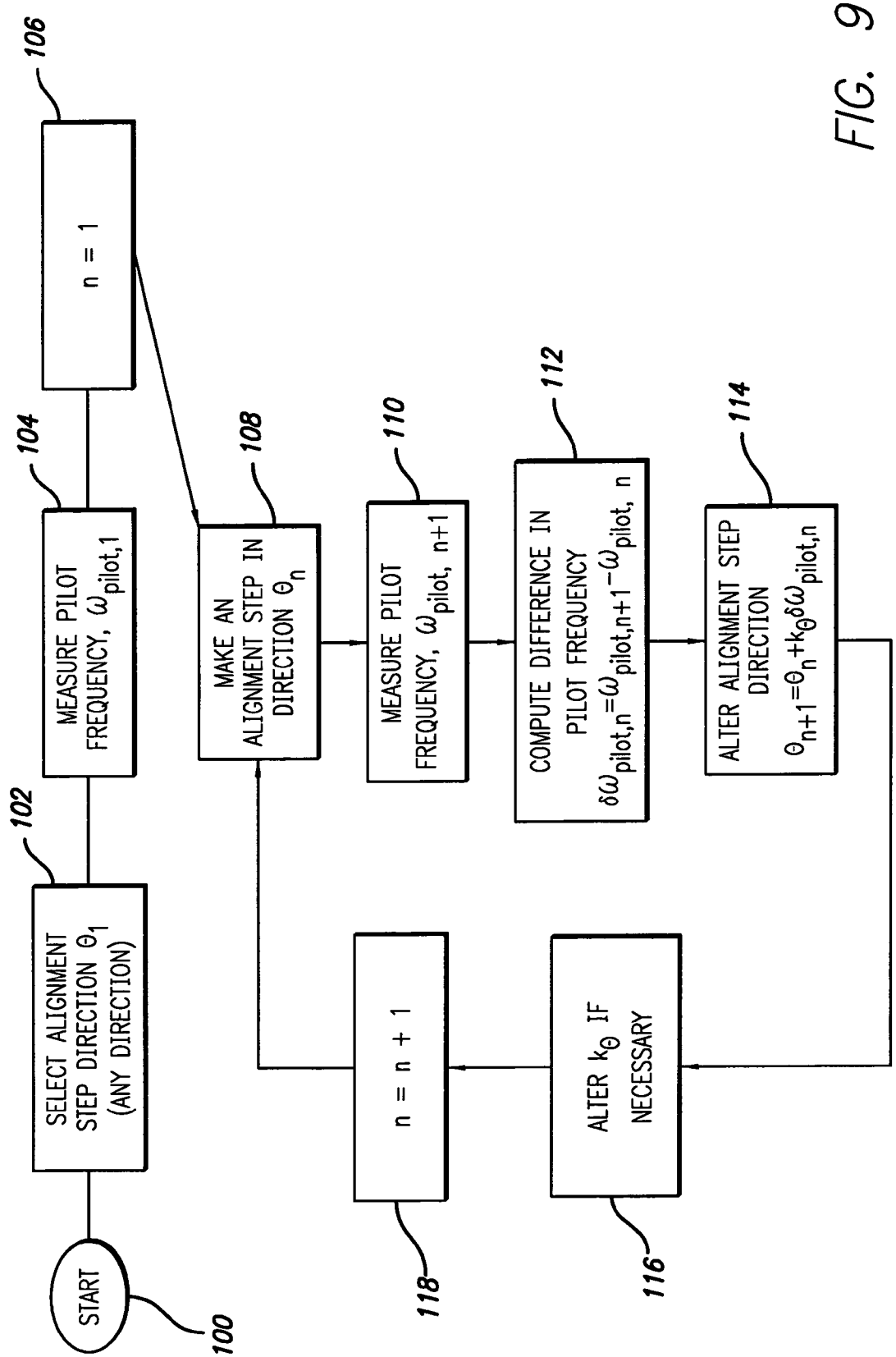

FEED FORWARD AMPLIFIER SYSTEM AND METHOD USING THE PILOT FREQUENCY FROM A POSITIVE FEEDBACK PILOT GENERATION AND DETECTION CIRCUIT TO IMPROVE SECOND LOOP CONVERGENCE

RELATED APPLICATION INFORMATION

The present application claims the benefit of provisional application Ser. No. 60/668,363 filed Apr. 5, 2005, and of provisional application Ser. No. 60/670,908 filed Apr. 13, 2005, the disclosures of which are incorporated herein by reference in their entirety.

BACKGROUND OF THE INVENTION

1. Field of the Invention

The present invention relates to RF power amplifiers and amplification methods. More particularly, the present invention relates to feed forward power amplifiers and methods of using a pilot to align the loops of a feed forward amplifier.

2. Description of the Prior Art and Related Information

A primary goal of RF power amplifier design is linearity over the range of power operation. Linearity is simply the ability to amplify without distortion. This requirement is critical for modern wireless communication systems but it is increasingly difficult to achieve. This is due primarily to the bandwidth requirements of modern wireless communication systems which are placing increasing demands on amplifier linearity. Feed forward compensation is a well known approach applied to amplifiers to improve linearity by estimating and canceling distortion. In feed forward RF power amplifiers an error amplifier is employed to amplify only distortion components which are then combined with the main amplifier output to cancel the main amplifier distortion component.

FIG. 1 illustrates a conventional feed forward amplifier design having a main amplifier 1 and an error amplifier 2. The basic elements also include delays 3, 4 in the main and error path, respectively, and main to error path couplers 5, 6, 7 and 8. Additional elements not shown are also typically present in a conventional feed forward architecture as is well known to those skilled in the art. The delays, couplers and error amplifier are designed to extract distortion components from the main path and inject out of phase distortion components from the error path into the main amplifier output at coupler 8 to substantially eliminate the distortion component in the main amplifier path.

The performance of a feed forward amplifier may typically be analyzed based on two cancellation loops. Loop 1, called the carrier cancellation loop, ideally provides a signal at the output of coupler 7 with the input RF carrier component cancelled and only a distortion component remaining. Loop 2 is referred to as the error cancellation loop or auxiliary path loop. In loop 2 the distortion component provided from coupler 7 is amplified by the error amplifier 2 and injected at coupler 8 to cancel the distortion component in the main path and ideally provide a distortion free signal at the output.

The quality of the distortion estimate (carrier cancellation) is determined by the alignment of the first loop in terms of gain and phase. The distortion cancellation in turn is determined by the alignment of the second loop in terms of gain and phase. In prior art systems, a pilot 9 is injected into the main amplifier path of the first loop, acting like a known distortion signal. The pilot signal is detected at the feed forward amplifier output by a pilot detector 10 and used to aid the alignment process for the second loop. When the second loop is aligned, the pilot is cancelled. If the second loop is misaligned, residual pilot power will be detected at the output of the feed forward amplifier. The degree of the misalignment is estimated from the measured power of the residual pilot. The alignment of the second loop is adjusted in an iterative manner with the goal of reducing the residual pilot power. Generally, it is desirable to have the feed forward amplifier control system adapt to the optimal settings as fast as possible to minimize the amount of time the amplifier operates at a less than optimal setting.

One difficulty with alignment control algorithms used to adjust the alignment settings (gain and phase) from any initial setting to that which results in the best measured alignment is the difficulty in finding the correct direction of adjustment in the two dimensional (2D) gain-phase space. Prior alignment control algorithms typically rely on either the "steepest descent" or the "coordinate descent" algorithms. The steepest descent algorithm adjusts the alignment settings in a direction of the gradient within the 2D gain-phase space. Dithering the alignment in orthogonal directions and measuring the changes in measured misalignment provides an estimate of the gradient. The coordinate descent algorithm performs two separate 1D searches along pre-defined orthogonal directions (usually the gain and phase axes). The alignments are dithered to determine which direction along the respective coordinates reduces measured misalignment. Both these approaches have disadvantages in practical systems which employ control processors with limited processing power and where fast loop alignment is desired. As a result the desired fast and accurate loop convergence has not been achieved in practical adaptive feed forward systems.

Accordingly, a need presently exists for a system and method for more rapid loop alignment control in a feed forward amplifier system.

SUMMARY OF THE INVENTION

In a first aspect the present invention provides a method for controlling alignment of a control loop in an amplifier system comprising generating a variable frequency pilot signal, injecting the pilot signal into the amplifier system, and detecting any uncanceled pilot signal at an output of the control loop. The method further comprises detecting the frequency of the generated pilot signal, adjusting one or more parameters of the control loop, detecting a frequency change in the variable frequency pilot signal and controlling the adjusting based on the detected frequency change.

In a preferred embodiment of the method for controlling alignment of a control loop in an amplifier system generating the variable frequency pilot signal comprises using feedback from the output of the amplifier system to generate the pilot signal. Adjusting one or more parameters preferably comprises adjusting the gain and phase of a signal path in the control loop using gain and phase adjusters, respectively, and the direction of the gain and phase adjustment is changed based on the detected frequency change in the pilot signal. In a preferred embodiment of the method the generated pilot signal is an RF signal. In one embodiment detecting the frequency of the generated pilot signal comprises detecting the RF frequency. Alternatively, the generated pilot signal is an RF signal generated by up converting an IF signal and detecting the frequency of the generated pilot signal comprises detecting the IF frequency of the IF signal.

According to another aspect the present invention provides a method for controlling alignment of a feed forward amplifier system comprising an input for receiving an input signal, a first carrier cancellation control loop coupled to the input and having a main amplifier, a second error cancellation control loop coupled to the first control loop and having an error amplifier and a gain adjuster and a phase adjuster, and an output coupled to the second control loop and providing an output signal. The method comprises sampling the output signal, generating a variable frequency pilot signal from the sampled output signal, injecting it into the first control loop, and detecting the frequency of the generated pilot signal. The method further comprises adjusting the settings of the gain and phase adjusters in the second control loop from a first adjustment setting to a second adjustment setting using an alignment direction, detecting the frequency of the generated pilot signal after the adjusting, detecting the difference in the frequency of the generated pilot signal between the first and second adjustment settings, altering the alignment direction using the frequency difference between the first and second adjustment settings. The method further comprise adjusting the settings of the gain and phase adjusters in the second control loop from the second setting to a third setting using the altered alignment direction.

In a preferred embodiment of the method for controlling alignment of a feed forward amplifier system, altering the alignment direction using the frequency difference between the first and second adjustment settings comprises multiplying the frequency difference by a direction change parameter. The method further comprises determining if the direction change parameter is too great or too small, and decreasing or increasing the direction change parameter if necessary. In one embodiment of the method the generated pilot signal is an RF signal and detecting the frequency of the generated pilot signal comprises detecting the RF frequency. In another embodiment of the method the generated pilot signal is an RF signal generated by up converting an IF signal and detecting the frequency of the generated pilot signal comprises detecting the IF frequency of the IF signal.

According to another aspect the present invention provides a feed forward amplifier comprising an RF input for receiving an RF signal, and a carrier cancellation loop comprising a main amplifier receiving and amplifying the RF signal, a main amplifier output sampling coupler, a first delay coupled to the RF input and providing a delayed RF signal, and a carrier cancellation combiner coupling the delayed RF signal to the sampled output from the main amplifier. The feed forward amplifier further comprises an error cancellation loop comprising an error amplifier receiving and amplifying the output of the carrier cancellation combiner, a gain adjuster and a phase adjuster coupled between the carrier cancellation combiner and error amplifier and respectively receiving gain and phase adjustment control signals, a second delay coupled to the output of the main amplifier, and an error injection coupler combining the output from the error amplifier and the delayed main amplifier output from the second delay so as to cancel distortion introduced by the main amplifier. The feed forward amplifier further comprises an RF output coupled to the error injection coupler output and providing an amplified RF signal, an output sampling coupler for providing a sampled output of the amplified RF signal, a and positive feedback pilot generator circuit for generating a pilot signal from the sampled output of the amplified RF signal and providing the pilot signal to the input of the main amplifier. The positive feedback pilot generator circuit includes a frequency detector for detecting the frequency of the generated pilot signal and provides a pilot frequency signal. A controller programmed with a loop control algorithm is coupled to receive the pilot frequency signal and outputs the gain and phase adjustment control signals to the gain adjuster and phase adjuster. The controller adjusts the direction of change of the gain and phase adjustment control signals provided to the gain adjuster and phase adjuster based on changes in the pilot frequency signal.

In a preferred embodiment of the feed forward amplifier the positive feedback pilot generator circuit further comprises means for providing a detected pilot power signal from the sampled output of the amplified RF signal which varies with the strength of the uncancelled distortion from the error cancellation loop and the controller is coupled to receive the detected pilot power signal. In a preferred embodiment the positive feedback pilot generator circuit comprises means for generating an intermediate frequency pilot signal from the sampled output of the amplified RF signal, a local oscillator providing a fixed frequency signal, and a mixer receiving the intermediate frequency pilot signal and fixed frequency signal and outputting the pilot signal at an RF frequency. In one embodiment, the positive feedback pilot generator circuit further comprises a sampling coupler, coupled to the output of the mixer and providing the sampled RF frequency pilot signal to the frequency detector, and the frequency detector detects the RF frequency of the pilot signal and provides the pilot frequency signal corresponding thereto to said controller. In another embodiment the positive feedback pilot generator circuit further comprises a sampling coupler, coupled to the output of the means for generating an intermediate frequency pilot signal, the sampling coupler providing the sampled intermediate frequency pilot signal to the frequency detector, and the frequency detector detects the frequency of the intermediate frequency pilot signal and provides the pilot frequency signal corresponding thereto to the controller. The means for generating an intermediate frequency pilot signal from the sampled output of the amplified RF signal may comprise a second mixer coupled to the local oscillator and receiving the sampled output of the amplified RF signal and providing an intermediate frequency sampled output signal and a band limiter for providing a band limited signal corresponding to uncancelled pilot signal in the sampled output. In a preferred embodiment the pilot frequency signal is a voltage corresponding to the detected frequency. In a preferred embodiment the control algorithm iteratively adjusts the alignment direction to minimize the detected frequency change. In a preferred embodiment the control algorithm also adjusts the amount of alignment direction change based on successive increases or decreases in the detected frequency change.

Further features and advantages will be appreciated from the following detailed description.

BRIEF DESCRIPTION OF THE DRAWINGS

FIG. 9 is a flow diagram illustrating an algorithm for selecting the step direction in the loop 2 alignment search in accordance with the present invention.

DETAILED DESCRIPTION OF THE INVENTION

The present invention provides a feed forward amplifier system and method which uses the pilot frequency from a positive feedback pilot generation and detection circuit to improve second loop convergence. A positive feedback pilot generation system is disclosed in U.S. patent application Ser. No. 10/838,985 filed May 5, 2004, the disclosure of which is incorporated herein by reference in its entirety. The pilot generation and detection system of the above-noted Ser. No. 10/838,985 application operates using an intermediate frequency (IF) detection circuit and positive feedback. It is used in a feed forward power amplifier to assist the automatic control of the second loop alignment. The pilot system generates a pilot tone when the second loop of a feed forward amplifier is misaligned. The pilot system also detects the residual pilot at the output of the feed forward amplifier, after the second loop cancellation. A voltage proportional to the log of the detected power is provided from the pilot system to an adaptive alignment controller. The adaptive controller adjusts the alignment of the second loop to minimize the detector voltage (log of the residual pilot power). In the present invention the pilot system also detects the frequency of the generated pilot tone and the system controller uses the frequency information to control the direction of the alignment adjustment steps to improve the convergence speed of second loop alignment.

Figure 1:
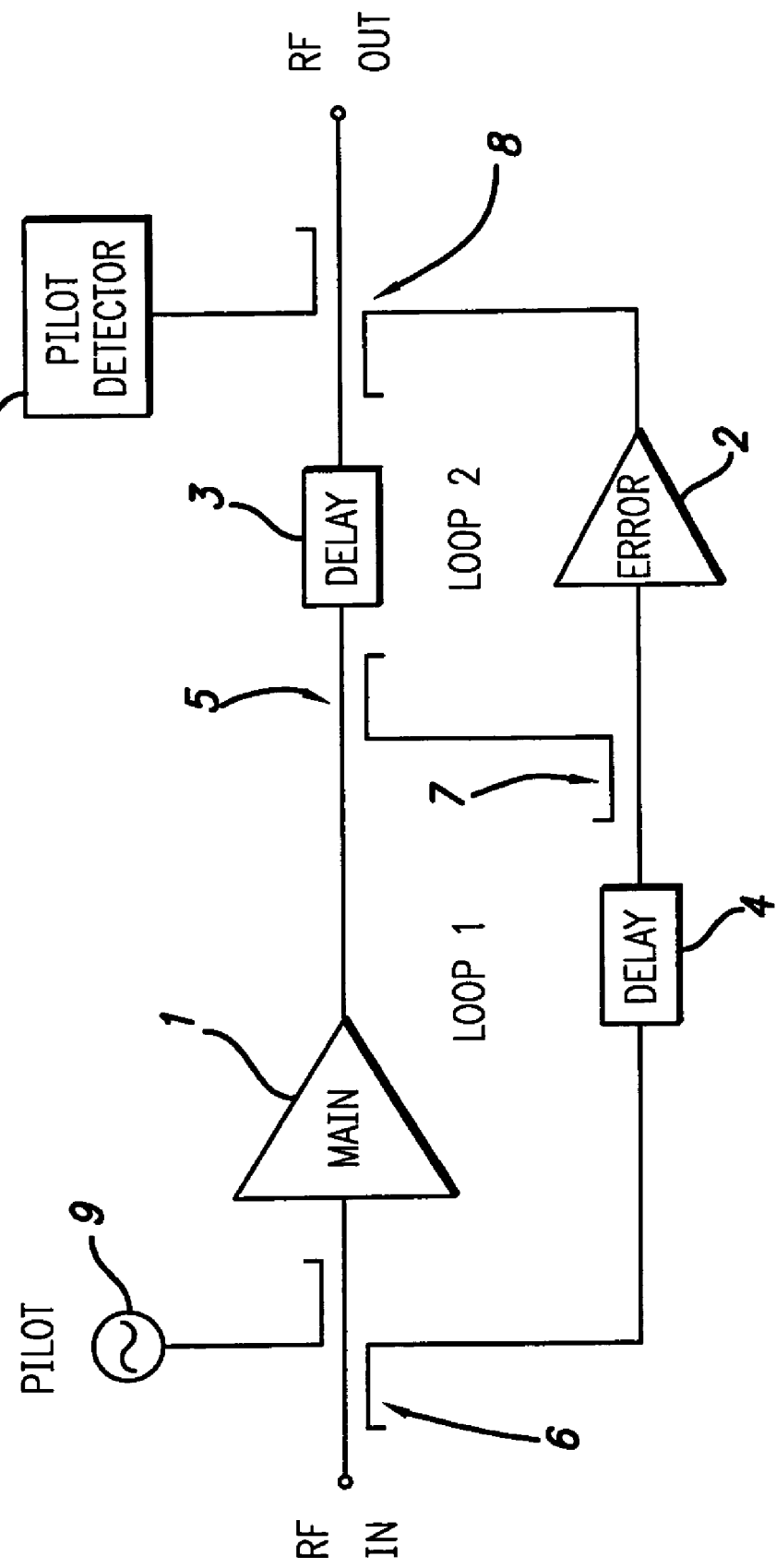
FIG. 1 is a block schematic drawing of a prior art feed forward power amplifier.
Figure 2:
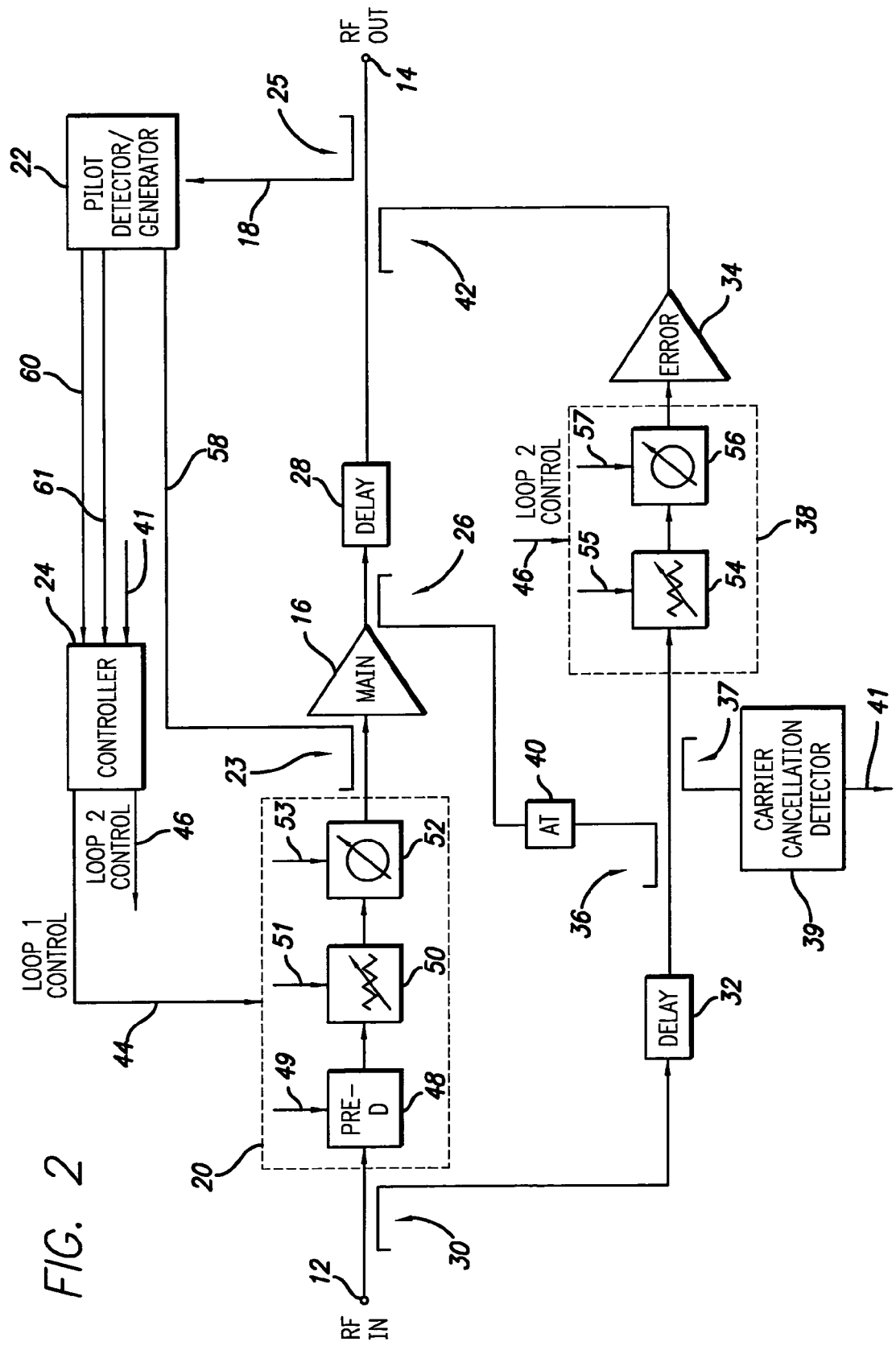
FIG. 2 is a block schematic drawing of a feed forward power amplifier employing a positive feedback pilot generation and detection circuit with measurement of pilot frequency in accordance with the present invention.
Figure 3:
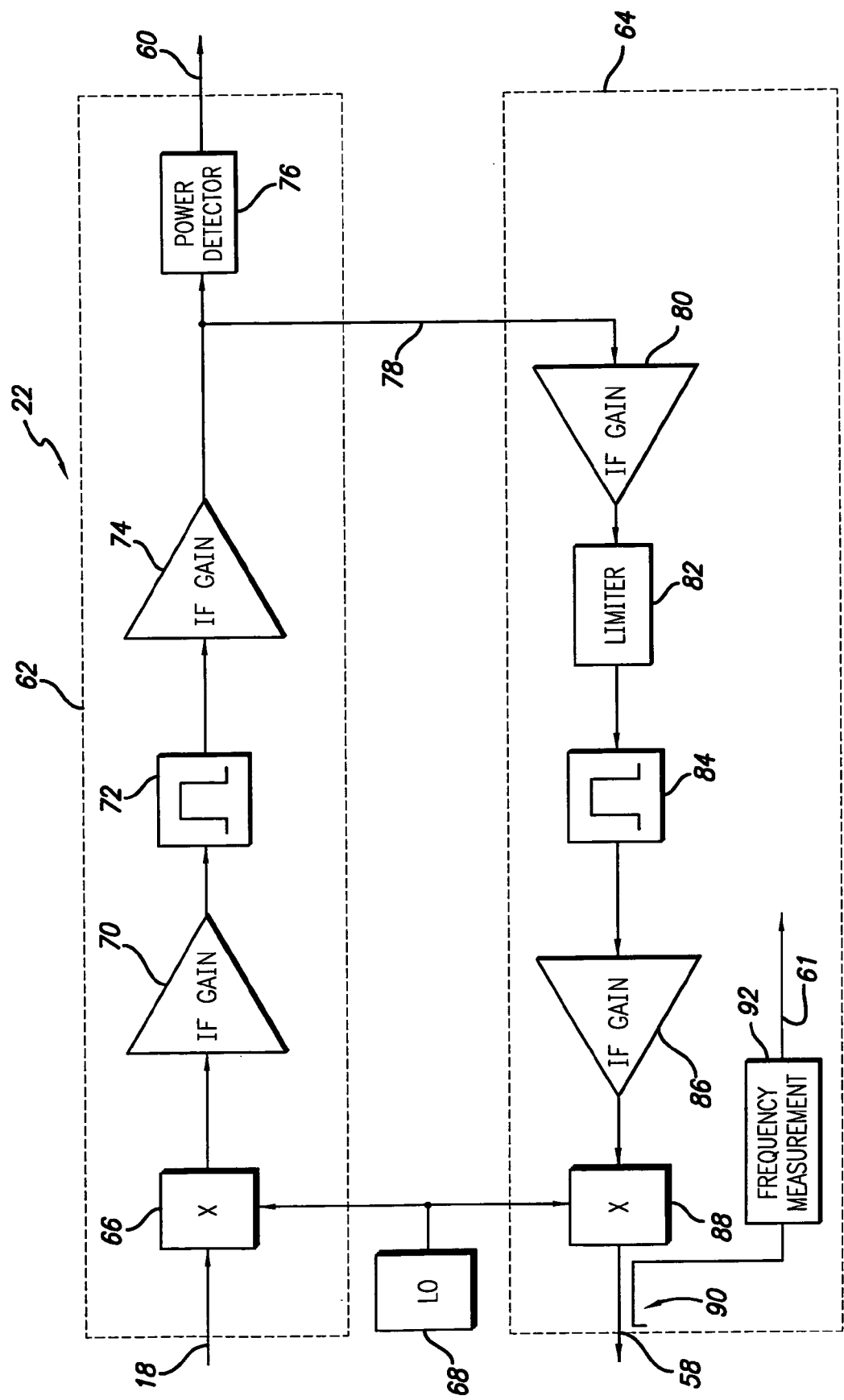
FIG. 3 is a block schematic drawing of a first embodiment of the positive feedback pilot generation and detection circuit employed in the feed forward power amplifier of FIG. 2 with measurement of pilot frequency at RF.
Figure 4:
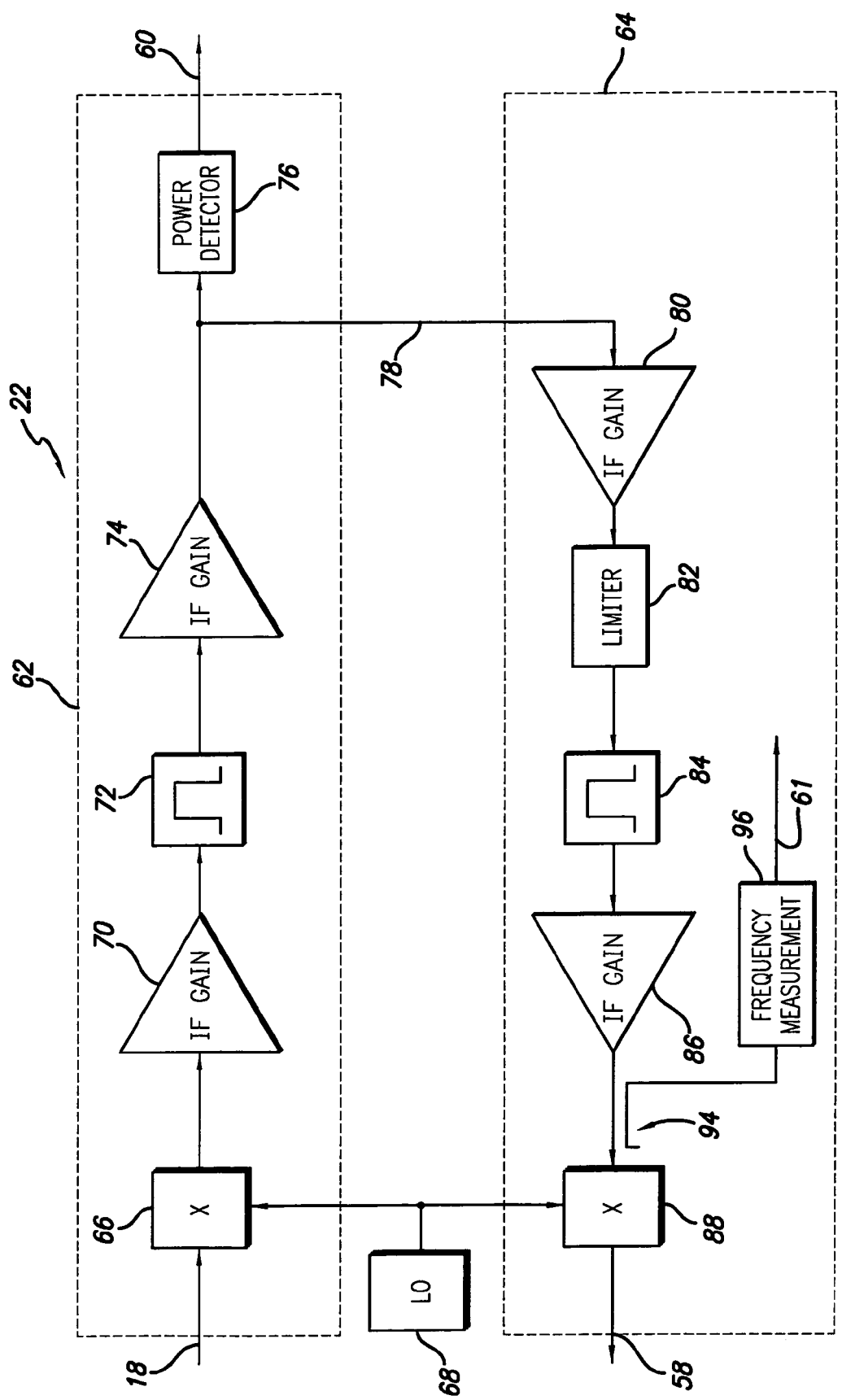
FIG. 4 is a block schematic drawing of a second embodiment of the positive feedback pilot generation and detection circuit employed in the feed forward power amplifier of FIG. 2 with measurement of pilot frequency at IF.

FIG. 2 is a block schematic drawing of a feed forward power amplifier employing a positive feedback pilot generation and detection circuit with measurement of pilot frequency in accordance with the present invention. Positive feedback pilot generation and detection circuits in accordance with two embodiments of the invention are shown in FIG. 3 and FIG. 4. FIG. 3 shows an embodiment employing frequency measurement performed on the RF pilot. FIG. 4 shows an embodiment employing frequency measurement performed on the IF pilot. Both embodiments are useful because the search algorithm uses the frequency difference of the pilot before and after a step in the alignment settings. It should also be appreciated that frequency measurements can be obtained from other positions within the RF and IF circuits (and such implementations are equally within the scope of the present invention). The feed forward amplifier of the present invention may also incorporate known features other than the novel aspects described in detail herein and such known features will not be described in detail. For example, additional features of a feed forward amplifier architecture and control system are described in U.S. patent application Ser. No. 10/365,111 filed Feb. 12, 2003, U.S. Pat. No. 6,794,933, the disclosure of which is incorporated herein by reference in its entirety.

Referring to FIG. 2, the feed forward amplifier includes an input 12 which receives an input RF signal to be amplified and an output 14 which outputs the amplified RF signal. The RF signal may be a high bandwidth signal such as a CDMA (Code Division Multiple Access) spread spectrum communication signal or WCDMA (Wide Code Division Multiple Access) signal or other RF signal. The input RF signal is split into a main amplifier signal path and an error amplifier signal path at input coupler 30 in accordance with well known feed forward amplifier design. The main amplifier signal path includes main amplifier 16. The main amplifier signal path further includes input and pre-distortion circuitry 20. The input circuitry may include conventional preamplifier and group delay circuitry (not shown), and gain and phase control circuitry 50, 52, respectively, implemented in accordance with conventional feed forward design. The pre-distortion circuitry 48 in turn pre-distorts the input signal to reduce IMDs introduced by main amplifier 16 and may be optional in some implementations. Input and predistortion circuitry 20 is controlled by loop 1 control signals 44 provided from controller 24. In particular, these control signals include predistortion control signals 49, gain adjuster settings 51 and phase adjuster settings 53.

A positive feedback pilot generation circuit 22 (described in detail in relation to FIGS. 3 and 4 below) provides a pilot signal 58 which is injected into the main amplifier input at pilot injection coupler 23 as illustrated and is used to control loop 2 alignment (as described below). The positive feedback pilot generation circuit 22 also provides a signal corresponding to the frequency of the generated pilot signal along line 61 to controller 24 which is used to improve the rate of convergence of the loop 2 alignment control (as described in more detail below). The pilot signal is extracted at the amplifier output by pilot sampling coupler 25 and detected by circuit 22 and the detected pilot signal 60 is used by controller 24 to provide the loop control to minimize the pilot signal in the output signal and thereby minimize distortion in the output signal (as described in more detail below). The main amplifier signal path further includes a main amplifier output sampling coupler 26 and delay 28, generally in accordance with conventional feed forward design.

Still referring to FIG. 2, the error amplifier signal path includes input signal coupler 30 which samples the RF input signal and provides it to the error amplifier 34 via delay 32, carrier cancellation combiner 36 and pre-error input circuitry 38. More specifically, delay 32 and carrier cancellation combiner 36 operate as in a conventional feed forward amplifier such that the sampled output of the main amplifier 16 is attenuated by attenuator 40 and combined with the delayed input signal at carrier cancellation combiner 36 to substantially cancel all but the distortion component of the sampled signal from the main signal path. This carrier cancellation completes loop 1 of the feed forward amplifier. The output of carrier cancellation combiner 36 is sampled by coupler 37 and the sampled signal is provided to carrier cancellation detector 39. The detected carrier cancelled signal 41 is provided to controller 24 which uses the detected signal to control the loop 1 gain and phase adjuster settings 51, 53 to minimize the detected carrier. In some applications and implementations it may be advantageous to control the loop 1 cancellation at combiner 36 to retain some RF carrier component in the resulting signal and the resulting signal is not purely the distortion component of the main amplifier. Nonetheless, for the purposes of the present application the resulting signal will be referred to as the distortion component and it should be understood some carrier component may be included. This distortion component of the signal is provided to pre-error input circuitry 38. Pre-error input circuitry 38 may include conventional preamplifier and group delay circuitry (not shown), and gain and phase control circuitry 54, 56. Controller 24 provides loop 2 control signals 46, comprising gain adjuster settings (α) on line 55 and phase adjuster settings (β) on line 57, to minimize the detected pilot from pilot detector 22. Unlike the main path a predistortion circuit is typically not required in the error path due to the more linear nature of the error amplifier operation. The output of circuitry 38 is provided to error amplifier 34 which restores the magnitude of the sampled distortion components (IMDs) to that in the main signal path. The amplified distortion component output from error amplifier 34 is combined out of phase with the delayed main amplifier output at error injection coupler 42 to cancel the distortion component in the main signal path. This error cancellation completes loop 2 of the amplifier. A substantially distortion free amplified signal is then provided to the output 14.

A sample of the output signal 18 is provided by coupler 25 to pilot detector and generator circuit 22. Any residual pilot signal in the output is detected by the pilot detector circuitry 22 and provided as a pilot power signal 60. The pilot power 60 is used by the controller 24, along with the carrier cancelled signal 41, to provide control signals 44 and 46. The two controls 44, 46 may be essentially independent and may be viewed as separate control of the two loops; loop 1 comprising circuitry 20, main amplifier 16, main amplifier output sampling coupler 26, attenuator 40, input signal coupler 30, group delay 32 and carrier cancellation combiner 36; and loop 2 comprising main amplifier sampling coupler 26, attenuator 40, carrier cancellation combiner 36, pre-error circuit 38, error amplifier 34, delay 28 and error injection coupler 42. Loop 1 control by controller 24 employs signal 41 to adjust gain and phase adjusters 50, 52 to minimize the detected carrier 41 at the output of Loop 1. Loop 2 control by controller 24 employs the detected pilot power 60 to adjust the gain and phase adjusters 54, 56 to minimize the detected pilot power 60 and the detected pilot frequency 61 to select the adjustment direction in the two dimensional gain/phase space to minimize the number of adjustment steps needed to reach the optimal adjustment settings, as described in more detail below.

Referring to FIG. 3, a preferred embodiment of the positive feedback pilot generator 22 is illustrated in a block schematic drawing. As shown the circuit comprises a detection signal path 62 and a pilot generation signal path 64. The sampled RF output 18 of the feed forward amplifier is the input to the detection path 62. (An alternative approach is to measure the output of a dynamic range extender (DRE), which provides the feed forward amplifier output with some carrier cancellation. Such a dynamic range extender is described in U.S. Pat. No. 6,147,555 issued Nov. 14, 2000, e.g., in FIGS. 14 and 15 thereof, the disclosure of which is incorporated herein by reference.) The detection portion 62 of the system preferably comprises a bandpass power detector circuit, which detects uncancelled power in a relatively narrow bandwidth portion of the sampled amplifier output 18 at a frequency outside of the RF carrier bandwidth. The bandpass power detector circuit preferably comprises a mixer 66, bandpass filter 72, and a power detector 76. IF gain stages 70, 74 may also be employed, depending on the signal strength of the sampled output 18. The RF input 18 to the detection path is down-converted to an IF frequency by Local Oscillator (LO) 68 and mixer 66. The IF signal is then bandpass filtered by filter 72 to provide a relatively narrow bandwidth signal including the pilot signal frequency. The power of this bandpass limited signal is then detected by power detector 76. Power detector 76 may comprise a log detector or RMS detector, for example. The output 60 of the power detector 76 corresponds to the residual pilot power after the second loop cancellation. This pilot power output 60 is provided to the feed forward loop controller 24 (FIG. 2).

The pilot generation circuitry 64 is preferably the reverse line-up of the bandpass power detector circuit with the addition of a limiter before the bandpass filter. The pilot generation circuit 64 preferably comprises a limiter 82, bandpass filter 84, mixer 88, and IF gain stages 80, 86. Additional or fewer IF gain stages may be employed, depending on signal strength. The pilot generation circuit 64 uses the bandpass filtered IF signal 78 from the detection path 62 as an input. The signal 78 is amplified by IF gain stage 80 then passed through limiting circuit 82 that clips the amplitude of the signal when the signal is above a threshold level. The limited signal is bandpass filtered by filter 84 then up-converted to RF by mixer 88 and LO 68, after a second IF gain stage 86 (if necessary).

The above-mentioned limiter 82 limits the amplitude of the pilot. The limiter 82 may be a device that reduces the amplitude of a signal exceeding a threshold or a nonlinear device that saturates when driven by a high level signal. Saturation, or gain reduction with increasing signal level, occurring in other parts within the pilot generator 64, such as the second multiplier 88 or IF gain stages 80, 86, may also provide a means of limiting.

The same LO 68 frequency is preferably used for both the pilot detection down-conversion at mixer 66 and the pilot generation up-conversion at mixer 88. The frequency of LO 68 is chosen to place the pilot signal outside of the bandwidth of the RF carrier of the input signal to the feed forward amplifier and to facilitate detection of the signal in circuit 62. Also, a suitable choice of LO frequency may allow a relatively inexpensive IF filter 72 to be employed. For example, a LO frequency of about 85 MHz frequency shift from the carrier band will allow an inexpensive SAW filter to be used, e.g. with a 5 MHz pass band. Various other choices of LO frequency and filter passband are also possible, however.

As further shown in FIG. 3 the pilot signal output line 58 of pilot generation circuitry 64 is sampled by sampling coupler 90 and the sampled output (pilot signal) is provided to frequency measurement circuit 92. Frequency measurement circuit 92 detects the RF frequency of the sampled pilot signal and provides a corresponding voltage signal along line 61 to controller 24 (FIG. 2).

An alternate embodiment of the pilot detection and generation circuit 22 is shown in FIG. 4. This embodiment is identical to FIG. 3 with the exception that the output pilot signal is measured at IF instead of RF. More specifically, as shown the IF pilot signal output from IF gain circuit 86 is sampled by sampling coupler 94 and the sampled IF output (IF pilot signal) is provided to frequency measurement circuit 96. Frequency measurement circuit 96 detects the IF frequency of the sampled pilot signal and provides a corresponding voltage signal along line 61 to controller 24 (FIG. 2).

In operation, the pilot detection and generation circuit 22 creates a narrow bandwidth, positive feedback loop through the main amplifier 16 and the second loop of the feed forward amplifier (FIG. 2). When combined with the limiting circuit 82, a limit-cycle oscillation will develop using noise present in the feed forward amplifier and the pilot system, assuming that the loop has sufficient gain. The cancellation of the second loop affects the gain and phase of the positive feedback loop. As a result, good alignment of the second loop will suppress the limit-cycle oscillation. The degree of alignment required to suppress the limit cycle is selectable based on the amount of IF gain provided by the IF gain stages preceding the limiter 82 or by adjusting the clipping threshold of limiter 82.

A number of modifications of the illustrated implementation of the positive feed back pilot generation circuit 22 are possible. For example, the circuit may employ an automatic level control circuit with related modifications in the overall circuit design, as described in application Ser. No. 11/369,529 filed Mar. 7, 2006, the disclosure of which is incorporated herein by reference in its entirety. Also, an implementation of the bandpass power detector circuit 62 may employ an RF filter which is placed before the mixer 66 to reject image frequencies. In such an approach, a similar RF filter is preferably included within the pilot generation path 64 after the mixer 88. Also, it is possible to eliminate the bandpass filter 84 within the pilot generation path 64. However, such an implementation without filter 84 may not be preferred since it will waste pilot energy by producing signal components that are not detectable by the bandpass power detector circuit 62. These additional spectral components will be attenuated by the second loop cancellation as part of the feed forward compensation. Also, as noted above, the number of IF gain stages, the threshold of limiter 82, the LO frequency and the filter passband bandwidth may all be varied in accordance with the particular implementation and the particular RF carrier being amplified.

Figure 5:
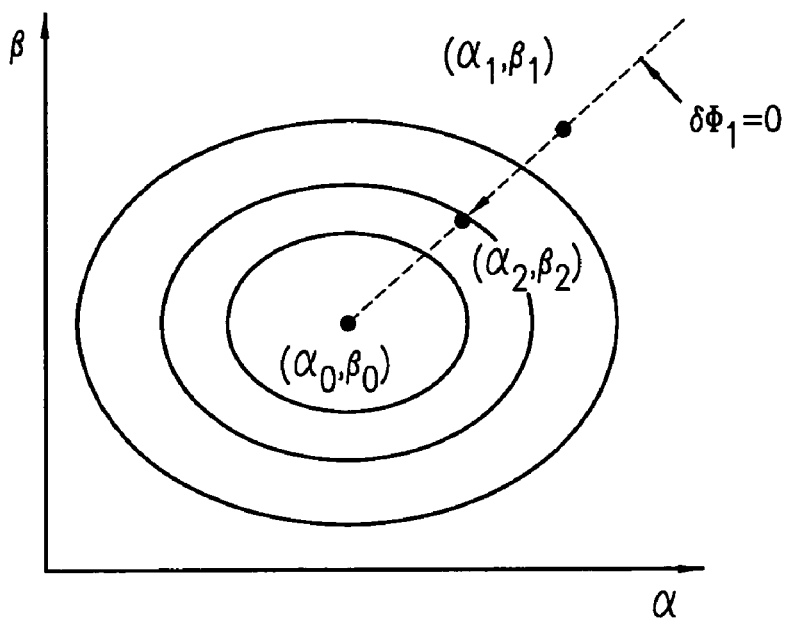
FIG. 5 is a contour plot illustrating no phase change, ($\delta\phi_1=0$), in response to an alignment step ($\alpha_2-\alpha_1,\beta_2-\beta_1$), which is in the direction of the optimal alignment ($\alpha_o,\beta_o$).
Figure 6:
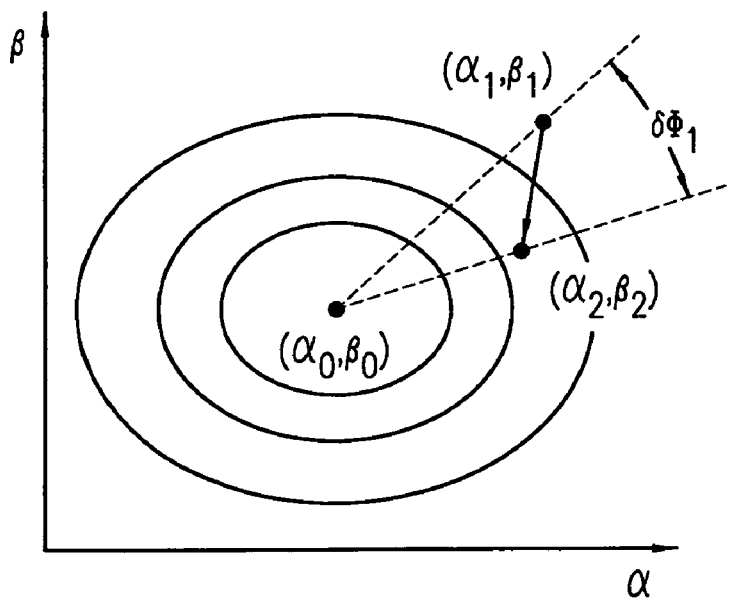
FIG. 6 is a contour plot illustrating phase change, $\delta\phi_1$, in response to an alignment step ($\alpha_2-\alpha_1,\beta_2-\beta_1$), which is not in the direction of the optimal alignment ($\alpha_o,\beta_o$).

Next the use of the pilot frequency for improved loop 2 convergence will be described in more detail. By measuring the frequency of the generated pilot, phase information regarding the second loop cancellation transfer function can be inferred. Changes in the pilot frequency as the search algorithm makes steps in the second loop alignment indicate errors in the direction of the search. The cancellation transfer function of the second loop is determined by gain and phase alignment adjusters (54, 56, respectively, in FIG. 2). Assume that the alignment adjuster is modeled as $$g_2 = \exp\{(\alpha_{opt} + \Delta\alpha_{opt}) + j(\beta_{opt} + \Delta\beta_{opt})\} \quad \text{(Eq. 1)}$$

where $\alpha_{opt}$ and $\beta_{opt}$ are the optimal gain and phase alignment settings, respectively, and $\Delta\alpha_{opt}$ and $\Delta\beta_{opt}$ are the misalignment in the gain and phase adjusters, respectively. Assuming the $|\Delta\alpha_{opt}|$ and $|\Delta\beta_{opt}|$ are small, the output of the pilot detector can be approximated as $$V_{det} \approx \log\{|k|^2 \cdot [(\Delta\alpha_{opt})^2 + (\Delta\beta_{opt})^2] + P_{min}\} \quad \text{(Eq. 2)}$$

where $|k|$ and $P_{min}$ are constants. It can be seen from (Eq. 2) that when the detected voltage is plotted as a function of the gain and phase adjuster settings, the resulting contours are concentric ellipses surrounding the optimal alignment setting (see FIG. 5 and FIG. 6).

The phase shift of the second loop cancellation transfer function is $$\phi = \arctan\left[\frac{\Delta\beta_{opt}}{\Delta\alpha_{opt}}\right]. \quad \text{(Eq. 3)}$$

It can be seen from (Eq. 3) that a step in the alignment setting that keeps the ratio $\Delta\beta_{opt}/\Delta\alpha_{opt}$ constant will not alter the cancellation phase. This corresponds to making an alignment step that is in the direction of the optimal alignment (see FIG. 5). If a step in the alignment setting is not in the direction of the optimal alignment, the phase will change (see FIG. 6). To illustrate the phase change, assume the initial alignment setting is $(\alpha_1,\beta_1)$ and the alignment after the step $(\Delta\alpha_1,\Delta\beta_1)$ is $(\alpha_2,\beta_2) = (\alpha_1+\Delta\alpha_1, \beta_1+\Delta\beta_1)$. The phases before and after the step are $$\phi_1 = \arctan\left[\frac{\beta_1 - \beta_{opt}}{\alpha_1 - \alpha_{opt}}\right] \quad \text{(Eq. 4)}$$

$$\phi_2 = \arctan\left[\frac{\beta_2 - \beta_{opt}}{\alpha_2 - \alpha_{opt}}\right], \quad \text{(Eq. 5)}$$

respectively. The phase change due to the step is $$\partial\phi_1 = \phi_2 - \phi_1. \quad \text{(Eq. 6)}$$

The frequency of the generated pilot generated is a natural mode of the positive feedback. It must be within the passband of the pilot system and create a loop phase that is a multiple of $2\pi$ radians. That is, the pilot frequency must satisfy $$n \cdot 2\pi = \omega_{pilot} \Delta_{loop} + \phi + \phi_o \quad \text{(Eq. 7)}$$

where $\omega_{pilot}$ is the pilot frequency, $\Delta_{loop}$ is the total loop delay, and $\phi_o$ is a phase offset. Changes in the phase of the cancellation transfer function of the second loop affect (Eq. 7). As a result, to preserve (Eq. 7), the pilot frequency must change as well. That is, the change in pilot frequency due to a phase change induced by alignment step 1 is $$\partial\omega_{pilot,1} = -\frac{\partial\phi_1}{\Delta_{loop}}. \quad \text{(Eq. 8)}$$

Thus, a change in the pilot frequency, measured at either IF or RF, will indicate changes in the phase of the second loop cancellation transfer function.

The manner in which the frequency change information is used to select the next step direction is next described. The first step direction is $$\theta_1 = \arctan\left[\frac{\beta_2 - \beta_1}{\alpha_2 - \alpha_1}\right] \quad \text{(Eq. 9)}$$

Figure 7:
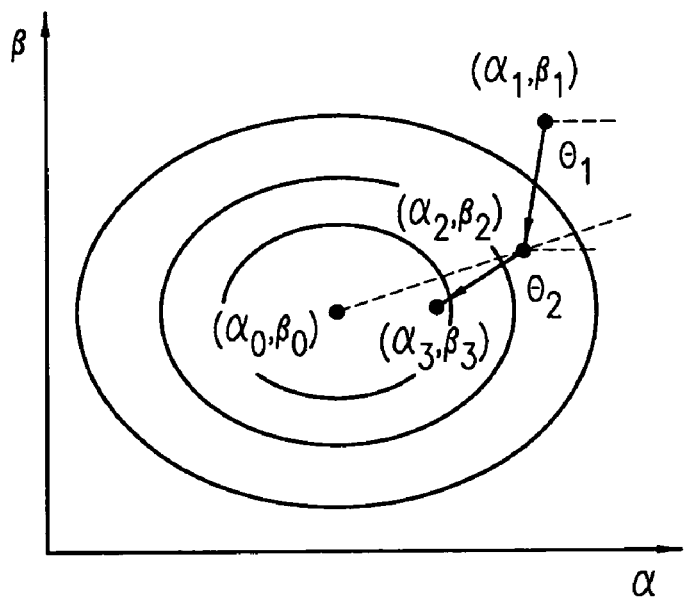
FIG. 7 is a contour plot illustrating change in step direction based on pilot frequency change, $\delta\omega_{pilot,1}$, when $k_\theta$ is too small.
Figure 8:
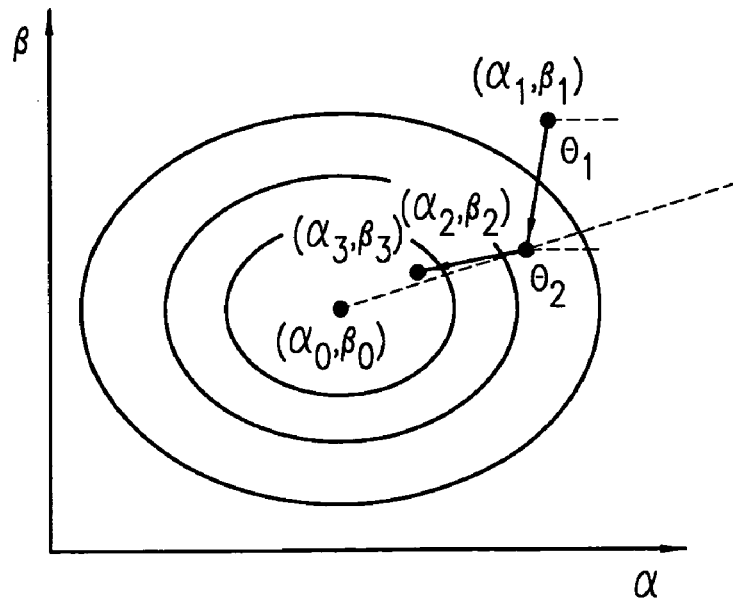
FIG. 8 is a contour plot illustrating change in step direction based on pilot frequency change, $\delta\omega_{pilot,1}$, when $k_\theta$ is too large.

The second step direction would be $$\theta_2 = \theta_1 + k_\theta \cdot \partial\omega_{pilot,1} \quad \text{(Eq. 10)}$$

where $k_\theta$ is a constant. FIG. 7 and FIG. 8 illustrate the effect that the selection of $k_\theta$ has on the search trajectory. In FIG. 7, the value of $k_\theta$ is too small making the new search direction, $\theta_2$, too small of a change from the first search direction, $\theta_1$. As a result, the pilot frequency will continue to increase. Successive increases (or decreases) in the pilot frequency suggest an increase in $k_\theta$ is needed. In FIG. 8, the value of $k_\theta$ is too large making the new search direction, $\theta_2$, too large of a change from the first search direction, $\theta_1$. As a result, the change in pilot frequency will alternate directions each step. Alternating changes in the pilot frequency suggest a decrease in $k_\theta$ is needed.

A preferred embodiment of the algorithm for selecting the step direction $\theta_{n+1}$ in the alignment search is shown in FIG. 9. As shown the algorithm initiates at 100 and at 102 an initial alignment step direction is selected, which initial direction may be arbitrary. Next at 104 the algorithm proceeds to measure the pilot frequency based on the pilot frequency signal provided to the controller along line 61 (FIG. 2). At 106 a counter is initialized to begin a series of alignment steps using measurements of the pilot frequency in order to optimize the step direction. More specifically, at 108, the algorithm initiates an alignment step ($\Delta\alpha_1, \Delta\beta_1$) in the initial alignment direction by incrementing the gain and phase adjuster settings corresponding to the selected direction. Next at 110 the algorithm proceeds to measure the pilot frequency at the new settings using the pilot frequency signal provided to the controller along line 61. Next at 112 the algorithm proceeds to compute the difference in the pilot frequency between the initial setting and the new setting. Next at 114 the difference in pilot frequency, determined at 112, is used to alter the alignment step direction, multiplying the difference in frequency by a constant value $k_\theta$ defining the amount of change in step direction (i.e. the size of the angle of direction change in 2D gain phase space). Next at 116 it is determined if the value of the constant $k_\theta$ is too large or too small and if necessary the value of the constant $k_\theta$ is increased or decreased (as described above in relation to FIGS. 7 and 8). Next at 118 the counter is incremented and the alignment adjustment step direction processing flow, 108, 110, 112, 114 and 116 is repeated. This iterative process flow continues as long as it is converging, which is indicated by a decreasing level of the detected pilot power 60. The detected pilot power 60, denoted by $V_{det}$, is measured at 104 and 110, and the difference, $\Delta V_{det}$, is computed at 112. The search is converging as desired when $\Delta V_{det}<0$.

For the case where the alignment adjustment step ($\Delta\alpha, \Delta\beta$) causes the iterative process to diverge, as indicated by $\Delta V_{det}>0$, the alignment adjustment direction is reversed by adding $\pi$ radians to (Eq. 10) and 114, and the step size is reduced before repeating 108. The algorithm for selecting the step size used at 108 may be the same as the power minimization approaches described in U.S. patent application Ser. No. 10/733,498 filed Dec. 11, 2003, U.S. Pat. No. 7,002,407, and U.S. patent application Ser. No. 11/018,216 filed Dec. 21, 2004, the disclosures of which are incorporated herein by reference in their entirety. The algorithm of FIG. 9 and additional aspects of alignment control processing described in the above noted applications and patents may be implemented in controller 24 using a suitably programmed microprocessor (additional details are described in the above noted patent applications incorporated herein by reference).

It is worth noting that the frequency change, $\delta\omega_{pilot}$, can be large due to the $2\pi$ radian multiple in (Eq. 7). When the frequency shifts near the edge of the passband of the pilot system, and a discrete frequency change of $2\pi n/\Delta_{loop}$ may occur to force the pilot frequency to remain within the passband. When large changes in frequency are detected, the measured value of $\delta\omega_{pilot}$ should not be used in 114. Within 114, $\delta\omega$ should be constrained, using instead a modified $\delta\omega_{pilot}$ whose magnitude $|\delta\omega_{pilot}|$ is limited or the $2\pi$ modulus of $\delta\omega_{pilot}$ possessing the smallest $|\delta\omega_{pilot}|$. Alternatively, the search algorithm in FIG. 9 can be restarted after detecting large frequency changes.

Large frequency changes also occur when the convergence of the iterative process is nearly complete. The pilot amplitude drops rapidly when the alignment is near an optimal setting because the loop gain of the positive feedback is no longer sufficient to maintain the pilot oscillation making the detected pilot frequency measurement 61 unreliable. Such converged conditions are desirable and are indicated by $V_{det}$ reaching its minimum value ($|\Delta V_{det}|>0$ for all possible alignment step directions). When this condition is detected, any search direction can be selected as long as it is varied over time.

An alternative embodiment of the algorithm for selecting the step direction in the alignment search is described below. Rather than selecting $k_\theta$, it is possible to base the search direction on the sign of the difference in the pilot frequency ($\delta\omega_{pilot}$). The search direction is updated using $$\theta_2 = \theta_1 + sgn\{\partial\omega_{pilot,1}\} \cdot \frac{\pi}{4} \qquad (Eq.\ 11)$$

when the detected pilot power 60 is decreasing (converging, $\Delta V_{det}<0$), and $$\theta_2 = \theta_1 + sgn\{\partial\omega_{pilot,1}\} \cdot \frac{3\pi}{4} \qquad (Eq.\ 12)$$

when the detected pilot power 60 is increasing (diverging, $\Delta V_{det}>0$). The search algorithm forces lateral movement in the trajectory relative to the direct path to the optimal setting. Lateral movement changes the angle $\delta\phi$ (see FIG. 6), causing a frequency change, $\delta\omega_{pilot}$. Note that $\delta\phi$ and $\delta\omega_{pilot}$ are proportional to the ratio of the step size and the distance to the optimal setting.

The algorithm also adjusts the step size to make the expected value of $|\delta\phi|$ constant. As an illustrative example, the step size can be increased by a factor of 1.4 when $|\delta\phi|<0.05$ and decreased by a factor of 0.5 when $|\delta\phi|>0.3$. The step size can also be decreased by 0.7 when $\Delta V_{det}>0$. Since both $\delta\phi$ and $\Delta V_{det}$ are used to adjust the step size, the search is better damped than if it was based on the detected pilot power 60 only. The best thresholds and step adjustment factors are dependent on the feed forward amplifier system and can be obtained easily using experiments.

The present invention has been described in relation to a presently preferred embodiment, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. A method for controlling alignment of a feed forward amplifier system comprising an input for receiving an input signal, a first carrier cancellation control loop coupled to the input and having a main amplifier and a delay, a second error cancellation control loop coupled to the first control loop and having an error amplifier and a gain adjuster and a phase adjuster, and an output coupled to the second control loop and providing an output signal, the method comprising:
   sampling the output signal;
   within the first carrier cancellation loop, splitting the input signal between two paths, one path containing the main amplifier, the other path containing the delay;
   generating a variable frequency pilot signal from the sampled output signal and injecting it into the first control loop into the path containing the main amplifier;
   measuring the frequency of the generated pilot signal;
   adjusting the settings of the gain and phase adjusters in said second control loop from a first adjustment setting to a second adjustment setting using an alignment direction;
   measuring the frequency of the generated pilot signal after said adjusting;

measuring the difference in the frequency of the generated pilot signal between said first and second adjustment settings;

altering the alignment direction using the frequency difference between said first and second adjustment settings; and adjusting the settings of the gain and phase adjusters in said second control loop from the second setting to a third setting using the altered alignment direction.

2. A method for controlling alignment of a feed forward amplifier system as set out in claim 1, wherein altering the alignment direction using the frequency difference between said first and second adjustment settings comprises multiplying the frequency difference by a direction change parameter.

3. A method for controlling alignment of a feed forward amplifier system as set out in claim 2, further comprising determining if the direction change parameter is too great or too small, and decreasing or increasing the direction change parameter if necessary.

4. A method for controlling alignment of a feed forward amplifier system as set out in claim 1, wherein the generated pilot signal is an RF signal and wherein measuring the frequency of the generated pilot signal comprises measuring the RF frequency.

5. A method for controlling alignment of a feed forward amplifier system as set out in claim 1, wherein the generated pilot signal is an RF signal generated by up converting an IF signal and wherein measuring the frequency of the generated pilot signal comprises measuring the IF frequency of said IF signal.

6. A feed forward amplifier, comprising:

an RF input for receiving an RF signal;

a carrier cancellation loop comprising a main amplifier receiving and amplifying said RF signal, a main amplifier output sampling coupler, a first delay coupled to the RF input and providing a delayed RF signal, and a carrier cancellation combiner coupling the delayed RF signal to the sampled output from the main amplifier;

an error cancellation loop comprising an error amplifier receiving and amplifying the output of the carrier cancellation combiner, a gain adjuster and a phase adjuster coupled between the carrier cancellation combiner and error amplifier and respectively receiving gain and phase adjustment control signals, a second delay coupled to the output of the main amplifier, and an error injection coupler combining the output from the error amplifier and the delayed main amplifier output from the second delay so as to cancel distortion introduced by the main amplifier;

an RF output coupled to the error injection coupler output and providing an amplified RF signal;

an output sampling, coupler for providing a sampled output of the amplified RF signal;

a positive feedback pilot generator circuit for generating a pilot signal from the sampled output of the amplified RF signal and providing the pilot signal to the input of the main amplifier, the positive feedback pilot generator circuit including a frequency detector for detecting the frequency of the generated pilot signal and providing a pilot frequency signal; and a controller programmed with a loop control algorithm, the controller coupled to receive the pilot frequency signal and outputting said gain and phase adjustment control signals to said gain adjuster and phase adjuster, the controller adjusting the direction of change of the gain and phase adjustment control signals provided to said gain adjuster and phase adjuster based on changes in the pilot frequency signal.

7. A feed forward amplifier as set out in claim 6, wherein said positive feedback pilot generator circuit further comprises means for providing a detected pilot power signal from the sampled output of the amplified RF signal which varies with the strength of the uncancelled distortion from the error cancellation loop and wherein said controller is coupled to receive the detected pilot power signal.

8. A feed forward amplifier as set out in claim 6, wherein said positive feedback pilot generator circuit comprises means for generating an intermediate frequency pilot signal from the sampled output of the amplified RF signal, a local oscillator providing a fixed frequency signal, and a mixer receiving the intermediate frequency pilot signal and fixed frequency signal and outputting the pilot signal at an RF frequency.

9. A feed forward amplifier as set out in claim 8, wherein said positive feedback pilot generator circuit further comprises a sampling coupler coupled to the output of said mixer and providing the sampled RF frequency pilot signal to said frequency detector, and wherein said frequency detector detects the RF frequency of said pilot signal and provides said pilot frequency signal corresponding thereto to said controller.

10. A feed forward amplifier as set out in claim 8, wherein said positive feedback pilot generator circuit further comprises a sampling coupler, coupled to the output of said means for generating an intermediate frequency pilot signal, said sampling coupler providing the sampled intermediate frequency pilot signal to said frequency detector, and wherein said frequency detector detects the frequency of said intermediate frequency pilot signal and provides said pilot frequency signal corresponding thereto to said controller.

11. A feed forward amplifier as set out in claim 8, wherein said means for generating an intermediate frequency pilot signal from the sampled output of the amplified RF signal comprises a second mixer coupled to the local oscillator and receiving the sampled output of the amplified RF signal and providing an intermediate frequency sampled output signal and a band limiter for providing a band limited signal corresponding to uncancelled pilot signal in the sampled output.

12. A feed forward amplifier as set out in claim 6, wherein said pilot frequency signal is a voltage corresponding to the detected frequency.

13. A feed forward amplifier as set out in claim 6, wherein said control algorithm iteratively adjusts the alignment direction to minimize the detected frequency change.

14. A feed forward amplifier as set out in claim 13, wherein said control algorithm adjusts the amount of alignment direction change based on successive increases or decreases in the detected frequency change.

* * * * *